(12) United States Patent
Yamanaka et al.

(10) Patent No.: US 7,873,128 B2
(45) Date of Patent: Jan. 18, 2011

(54) METHOD AND SYSTEM FOR EQUALIZATION IN A COMMUNICATIONS SYSTEM

(75) Inventors: Akira Yamanaka, Union City, CA (US); Anand Shah, San Francisco, CA (US)

(73) Assignee: Broadcom Corporation

( * ) Notice: Subject to any disclaimer, the term of this patent is extended or adjusted under 35 U.S.C. 154(b) by 1590 days.

(21) Appl. No.: 10/773,610

(22) Filed: Feb. 6, 2004

(65) Prior Publication Data

US 2004/0224651 A1 Nov. 11, 2004

Related U.S. Application Data

(60) Provisional application No. 60/445,713, filed on Feb. 7, 2003.

(51) Int. Cl.
*H04B 1/10* (2006.01)

(52) U.S. Cl. .................. 375/350; 375/346; 375/260

(58) Field of Classification Search .......... 375/229, 375/232, 233, 262, 265, 346, 350, 260
See application file for complete search history.

(56) References Cited

U.S. PATENT DOCUMENTS

| | | | | |
|---|---|---|---|---|
| 5,052,000 A * | 9/1991 | Wang et al. | ............... | 714/758 |
| 5,546,430 A * | 8/1996 | Liao et al. | ............... | 375/341 |
| 6,012,161 A * | 1/2000 | Ariyavisitakul et al. | ..... | 714/795 |
| 6,067,655 A * | 5/2000 | Kovacs et al. | ............... | 714/762 |
| 6,088,390 A * | 7/2000 | Russell et al. | ............... | 375/233 |
| 6,167,082 A * | 12/2000 | Ling et al. | ............... | 375/233 |
| 6,690,739 B1 * | 2/2004 | Mui | ............... | 375/265 |
| 6,850,493 B1 * | 2/2005 | Ojard et al. | ............... | 370/252 |
| 6,898,239 B2 * | 5/2005 | Singvall | ............... | 375/233 |
| 7,050,517 B1 * | 5/2006 | Sallaway et al. | ............ | 375/350 |
| 7,130,343 B2 * | 10/2006 | Schmidt et al. | ............. | 375/233 |
| 7,187,730 B1 * | 3/2007 | Hu et al. | ............... | 375/343 |
| 7,212,569 B1 * | 5/2007 | Clark | ............... | 375/233 |
| 7,746,925 B1 * | 6/2010 | Hsu et al. | ............... | 375/233 |
| 2001/0009565 A1 * | 7/2001 | Singvall | ............... | 375/233 |
| 2001/0036223 A1 * | 11/2001 | Webster et al. | ............... | 375/152 |
| 2002/0116667 A1 * | 8/2002 | McEwen et al. | ............... | 714/39 |
| 2003/0123586 A1 * | 7/2003 | Yen | ............... | 375/350 |
| 2003/0161421 A1 * | 8/2003 | Schmidt et al. | ............. | 375/346 |
| 2003/0223489 A1 * | 12/2003 | Smee et al. | ............... | 375/233 |
| 2004/0032905 A1 * | 2/2004 | Dittrich et al. | ............... | 375/233 |
| 2004/0091023 A1 * | 5/2004 | Chen et al. | ............... | 375/148 |
| 2004/0101068 A1 * | 5/2004 | Wang et al. | ............... | 375/324 |
| 2004/0125884 A1 * | 7/2004 | Wei et al. | ............... | 375/265 |
| 2004/0131109 A1 * | 7/2004 | Kim et al. | ............... | 375/148 |
| 2005/0201456 A1 * | 9/2005 | Lakkis | ............... | 375/232 |
| 2005/0226341 A1 * | 10/2005 | Sun et al. | ............... | 375/260 |

\* cited by examiner

*Primary Examiner*—Emmanuel Bayard
(74) *Attorney, Agent, or Firm*—McAndrews, Held & Malloy, Ltd.

(57) ABSTRACT

Aspects for equalization in a communications system are described. The aspects include utilizing a block code based error correction scheme in a modulation system of the communication system, and removing cursor inter-symbol interference within an error correction code word to make code word decision with minimum error power-based criteria in the block code based error correction scheme.

17 Claims, 2 Drawing Sheets ically to a decision feedback equalization system with block code based error correction in a modulation system.

BACKGROUND OF THE INVENTION

One increasingly popular application for wireless systems are wireless local area networks (WLANs) of computer systems. Prominent in the field of home and business, wireless computer networks include the wireless standards known as 802.11. The first standard to be available in commercial products was 802.11b. It supports data rates from 1 Mb/s to 11 Mb/s. To ensure data integrity at such data rates, the communication encompasses many considerations, including equalization of distortion.

Decision feedback equalizations (DFE) are known to be powerful methods to equalize a distortion caused by multipath channels, and still have rather small implementation complexities. However, if the communication system utilizes error correction codes, a DFE is not possible to implement due to a delay required for decoding of the error correction code, which makes the decision for the feedback no longer available for the equalization of a next symbol.

One of the ways to resolve such a problem is to use a raw symbol for a decision before the post cursor cancellation by the feedback equalization filtering and after the feed forward equalization filtering. But in this technique the raw symbol used to make a decision has post cursor interference, and the probability of decision error is higher. Once the decision error happens, equalization for the next symbol will not be as reliable as a correct decision case. Because of this, the raw symbol based decision schemes suffer severe performance degradation, especially when the coding gain is larger.

Accordingly, a need exists for an optimal equalization algorithm for a communication system with block code based error correction that resolves the delay of decision availability. The present invention addresses such a need.

SUMMARY OF INVENTION

Aspects for equalization in a communications system are described. The aspects include utilizing a block code based error correction scheme in a modulation system of the communication system, and removing cursor inter-symbol interference within an error code correction word to make code word decision with minimum error power-based criteria in the block code based error correction scheme.

These aspects are achieved by having a decision feedback equalization filter, which only removes symbol interferences from the previous error correction code words. Further a matrix multiplication-based filtering (distortion filtering) is inserted after a feed forward equalizer filtering and the feedback filtering for symbol interference from the symbols in the previous error correction code words. And, scalar terms for each error correction code word are added to a decision metric of the real part of the projection of the above filtered symbols to the error correction code words.

DETAILED DESCRIPTION OF PREFERRED EMBODIMENTS

The present invention relates to decision feedback equalization system with block code based error correction in a modulation system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Embodiments and examples of the present invention are described below. While particular applications and methods are explained, it should be understood that the present invention can be used in a wide variety of other applications and with other techniques within the scope of the present invention.

Figure 1:
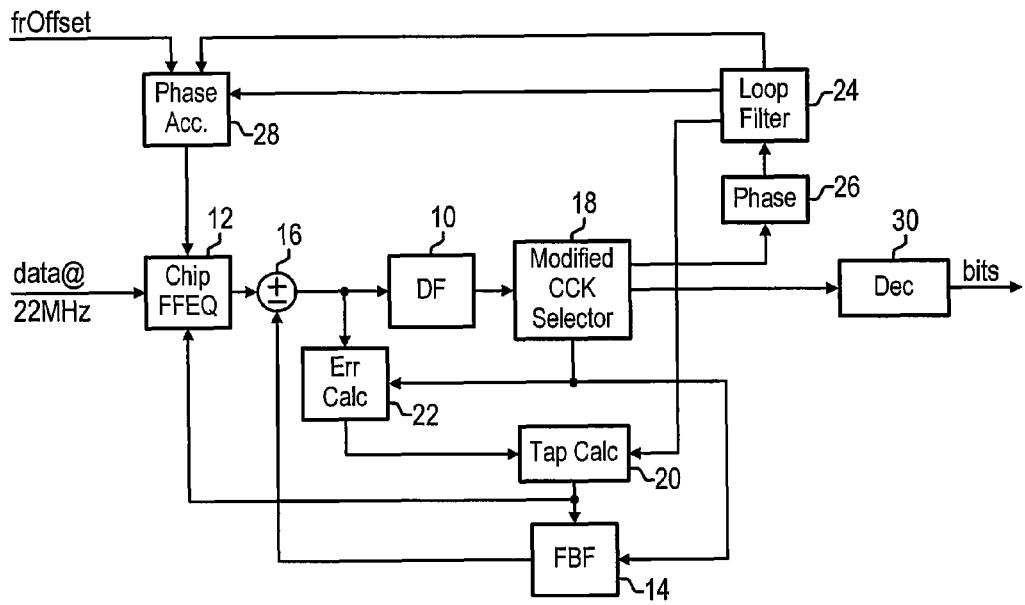
FIG. 1 is a block diagram illustrating an overall system diagram for the present invention.

FIG. 1 illustrates an overall system diagram with an example embodiment for 802.11b CCK modulation systems. It should be appreciated that the ideas of the invention are applicable for any general block coding error correction schemes by replacing the Fast Walsh Transform shown with a regular projection to error correction words.

Referring now to FIG. 1, the system includes a decision feedback (DF) equalizer 10 after a feed forward equalizer (FFEQ) 12, the FFEQ 12 receiving data at 22 MHz, and after a feedback filter (FBF) 14 subtraction by subtraction logic 16. Modified CCK selector 18 is coupled to the output of the DF 10 and includes an 'iciWeight' based code word estimation, as described further hereinbelow. A tap calculator 20 is coupled to receive data from an error calculator (Err calc) 22, the error calculator 22 coupled to the output of the subtraction logic 16 and to an output of the modified CCK selector 18. The tap calculator 20 is also coupled to receive data from a loop filter 24 and an output tap data to FBF 14, the FBF 14 also coupled to modified CCK selector 18. The modified CCK selector 18 is further coupled to phase logic 26 which sends phase data to the loop filter 24, the loop filter 24 coupled to Phase Accumulator 28. Phase Accumulator 28 also receives offset frequency (FrOffset) data and passes data to the FFEQ 12. The system outputs code bits from the modified CCK selector 18 through decision (Dec) logic 30.

Figure 2:
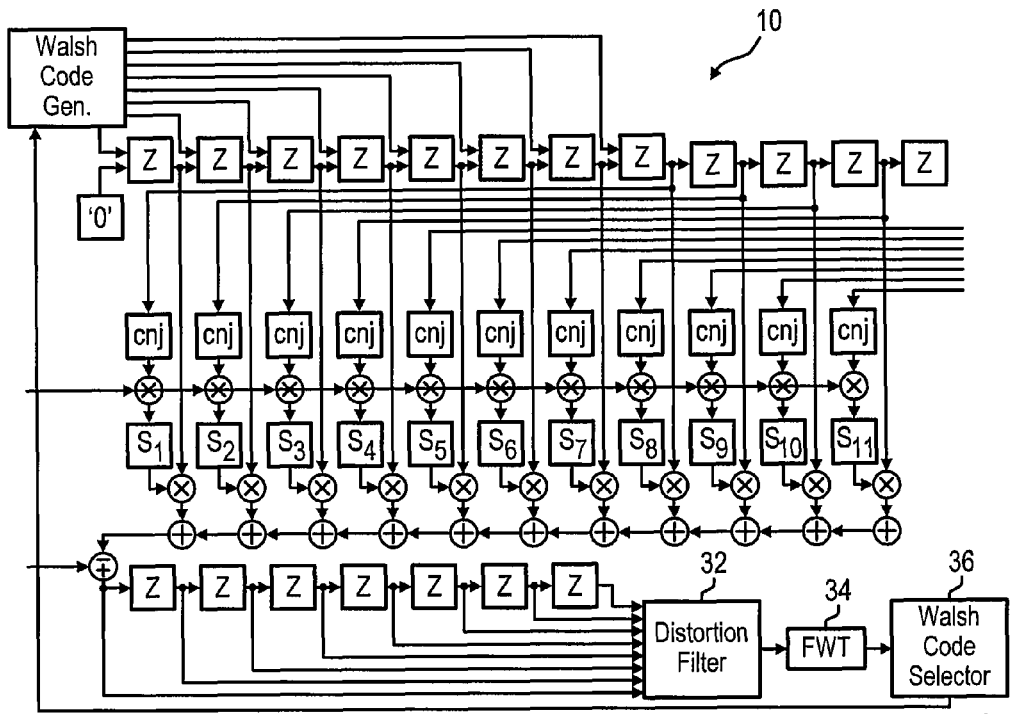
FIG. 2 is a block diagram illustrating a decision feedback equalization filter operation for the present invention.

FIG. 2 illustrates more particularly a block diagram of the operation of the DF 10 in the system of the present invention. In general, the example implementation in FIG. 2 illustrates a feedback equalizer using LMS (least mean square??) tap update including distortion filtering and a Walsh code selector, where to cancel the interference from the previous error correction code words, the delay tapped line has a mechanism to feed the last decoded Walsh code when it becomes available. Otherwise zero is fed. For the tap update calculation, delayed decisions are fed.

For the distortion filtering by distortion filter 32, the operation is defined as $$out = R \cdot in$$

where in and out are the input and output symbol vectors of length 8 and R is defined as:

$$R = \begin{bmatrix} 1 & 0 & 0 & 0 & 0 & 0 & 0 & 0 \\ c^1 & 1 & 0 & 0 & 0 & 0 & 0 & 0 \\ c^2 & c^1 & 1 & 0 & 0 & 0 & 0 & 0 \\ c^3 & c^2 & c^1 & 1 & 0 & 0 & 0 & 0 \\ c^4 & c^3 & c^2 & c^1 & 1 & 0 & 0 & 0 \\ c^5 & c^4 & c^3 & c^2 & c^1 & 1 & 0 & 0 \\ c^6 & c^5 & c^4 & c^3 & c^2 & c^1 & 1 & 0 \\ \cdot & \cdot & \cdot & \cdot & \cdot & \cdot & \cdot & \cdot \end{bmatrix}$$

where ci is the optimal DFE coefficients for the i-th post cursor interference rejection.

For the fast walsh transform (FWT) 34 operation, $$out_i = \sum_{i=0}^{7} w * ij \cdot in_i$$

Where, in and out are the input and output symbol vectors of length 8 and wij is the i-th element of j-th Walsh codes.

From the Walsh code selector 36, the index of the most likely error correction code word is returned as follows:

$$Codeno = maxidx(iciWeight - 2 \cdot maxabs)$$

Here, maxidx( ) returns the index of the maximum element of the input vector and maxabs is a vector calculated as:

$$maxabs_i = max(abs(real(corr_i)), abs(imag(corr_1)))$$

The 'iciWeight' vector calculation for the code word dependent scalar terms are defined as:

$$iciWeight_i = w_i * R * \cdot * R \cdot w_i$$

where wi is the i-th error correction code word. The symbol '*' represents Hermetian (conjugate transpose) operation.

Figure 3:
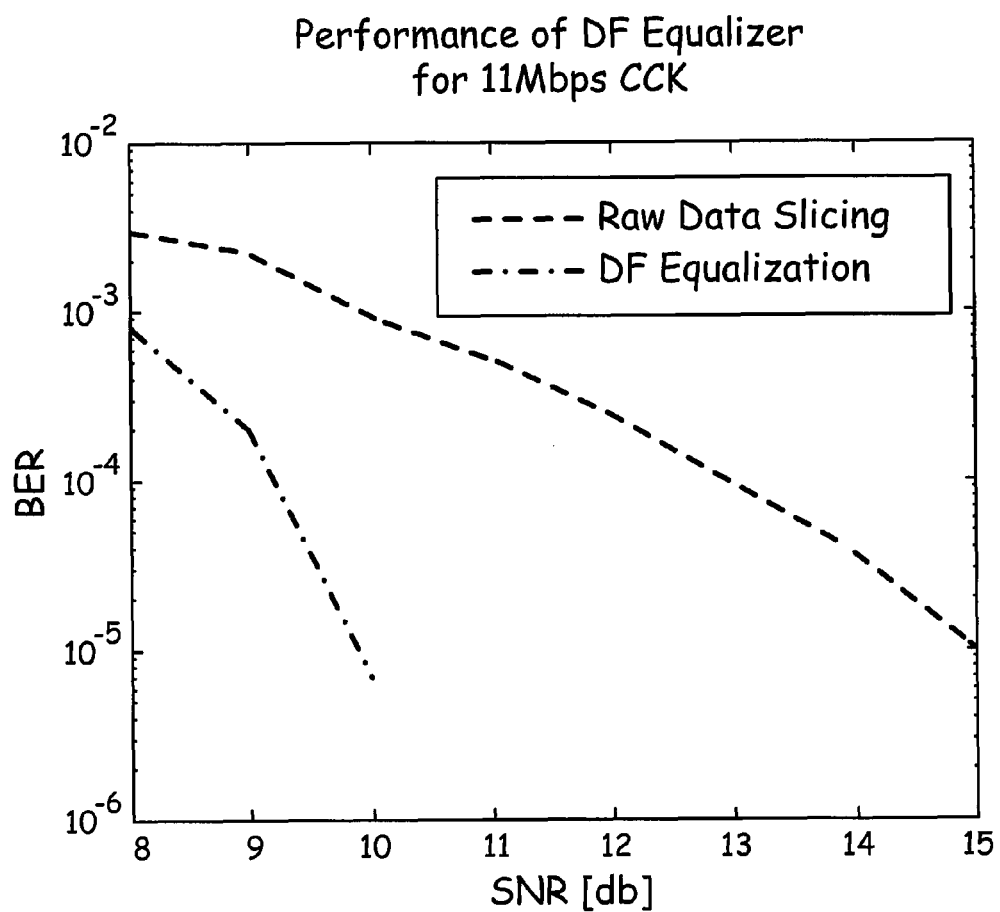
FIG. 3 is a graph illustrating performance improvement with the present invention.

The plot of FIG. 3 shows the performance improvement with the DF equalization of the present invention (indicated by the solid plot line) compared to raw data slicing-based DFE (indicated by the dashed plot line) for 11 Mbps CCK. As shown, an improvement of about 5 db is seen in the signal to noise ratio (SNR) for the bit error rate (BER).

Thus, through the present invention, a code word decision is made with minimum error power based criteria by removing the post cursor inter symbol interference within the error correction code words. This is achieved by: (1) having a decision feedback equalization filter, which only removes symbol interferences from the previous error correction code words; (2) inserting a matrix multiplication-based filtering (distortion filtering) after a feed forward equalizer filtering and after the feedback filtering for symbol interference from the symbols in the previous error correction code words; and (3) having scalar terms for each error correction code word added to a decision metric of the real part of the projection of the above-filtered symbols to the error correction code words.

Although the present invention has been described in accordance with the embodiments shown, one of ordinary skill in the art will readily recognize that there could be variations to the embodiments and those variations would be within the spirit and scope of the present invention. For example, in one variation of the invention, the distortion filter handles the removal of all the post cursor interference up to the length of the error correction word. In this case, there is no need to have feed back equalization filter taps for the length of the error correction word. The matrix for the distortion filtering would not be square any more, as shown in the following:

$$R = \begin{bmatrix} c^7 & c^6 & c^5 & c^4 & c^3 & c^2 & c^1 & 1 & 0 & 0 & 0 & 0 & 0 & 0 & 0 \\ 0 & c^7 & c^6 & c^5 & c^4 & c^3 & c^2 & c^1 & 1 & 0 & 0 & 0 & 0 & 0 & 0 \\ 0 & 0 & c^7 & c^6 & c^5 & c^4 & c^3 & c^2 & c^1 & 1 & 0 & 0 & 0 & 0 & 0 \\ 0 & 0 & 0 & c^7 & c^6 & c^5 & c^4 & c^3 & c^2 & c^1 & 1 & 0 & 0 & 0 & 0 \\ 0 & 0 & 0 & 0 & c^7 & c^6 & c^5 & c^4 & c^3 & c^2 & c^1 & 1 & 0 & 0 & 0 \\ 0 & 0 & 0 & 0 & 0 & c^7 & c^6 & c^5 & c^4 & c^3 & c^2 & c^1 & 1 & 0 & 0 \\ 0 & 0 & 0 & 0 & 0 & 0 & c^7 & c^6 & c^5 & c^4 & c^3 & c^2 & c^1 & 1 & 0 \\ 0 & 0 & 0 & 0 & 0 & 0 & 0 & c^7 & c^6 & c^5 & c^4 & c^3 & c^2 & c^1 & 1 \end{bmatrix}$$

As an additional implementation option, the following is available: A simplified way of implementation for a certain class of error correction codes, where an efficient fast transform is available to calculate the projections of symbols to error correction code words. The 'iciWeight' calculation can be performed flowingly using a fast transform:

$$proj_i = w_i * \cdot R* = [ft_i(c_0*)ft_i(c_1*)ft_i(c_2*)ft_i(c_3*)ft_i(c_4*) \\ ft_i(c_5*)ft_i(c_6*)ft_i(c_7*)]iciWeight_i = proj_i \cdot proj_i*$$

where, ci is a column vector, which is defined as:

And a function '$ft_i(\ )$' is the i-th outputs of the fast transform.

Another further simplified way of 'iciWeight' calculation: First, the following matrix and vectors are defined:

$$A = R* \cdot R = [a_0 a_2 a_3 a_4 a_5 a_6 a_7]$$

Then, the 'iciWeight' can be calculated using a fast transform as:

$$iciWeight_i = [ft_i(a_0)ft_i(a_1)ft_i(a_2)ft_i(a_3)ft_i(a_4)ft_i(a_5) \\ ft_i(a_6)ft_i(a_7)] \cdot w_i$$

Accordingly, many modifications may be made by one of ordinary skill in the art without departing from the spirit and scope of the appended claims.

What is claimed is:

1. A method for equalization in a communications system, the method comprising:
   removing post cursor inter-symbol interference (ISI) within at least one error correction code word in a block code based error correction scheme,
   wherein said block code based error correction scheme utilizes a feed forward equalizer filter for filtering at least a feedback signal comprising information from said at least one error correction code word, and wherein said feedback signal comprises phase data.

2. The method of claim 1, wherein said removing of said post cursor inter-symbol interference comprises removing symbol interferences from at least one previous error correction code word utilizing a decision feedback equalization filter.

3. The method of claim 2, wherein said removing of said post cursor inter-symbol interference comprises utilizing distortion filtering in said decision feedback equalization filter, for generating filtered symbols.

4. The method of claim 3, wherein said utilizing of said distortion filtering comprises inserting a matrix multiplication-based filter after a feed forward equalizer filter and a feedback filter in the communication system, for symbol interference from symbols in said at least one previous error correction code word.

5. The method of claim 3, wherein said removing of said post cursor inter-symbol interference comprises adding scalar terms for each of said at least one error correction code word to a decision metric of a real part of a projection of said filtered symbols to said at least one error correction code word.

6. The method of claim 1, wherein said block code based error correction scheme is utilized in a modulation system of the communication system.

7. The method of claim 1, comprising:
selecting a code word for said block code based error correction scheme, based on said removing of said post cursor inter-symbol interference within said at least one error correction code word.

8. A system for equalization in a communications system, the system comprising:
a modulation system utilizing a block code based error correction scheme; and
a feedback equalization filter provided within said modulation system for removing post cursor inter-symbol interference (ISI) within at least one error correction code word to make at least one code word decision in said block code based error correction scheme, wherein said block code based error correction scheme utilizes a feed forward equalizer filter for filtering at least a feedback signal comprising information from said at least one error correction code word, and wherein said feedback signal comprises phase data.

9. The system of claim 8, wherein said feedback equalization filter removes symbol interferences from at least one previous error correction code word.

10. The system of claim 9, wherein said feedback equalization filter comprises a distortion filter that generates filtered symbols.

11. The system of claim 10, wherein said distortion filter comprises a matrix multiplication-based filter inserted after a feed forward equalizer filter and a feedback filter for symbol interference from symbols in said at least one previous error correction code word.

12. The system of claim 10, comprising a decision metric for said feedback equalization filter, wherein scalar terms are added for each of said at least one error correction code word to a decision metric of a real part of a projection of said filtered symbols to said at least one error correction code word.

13. A method for equalization in a communications system, the method comprising:
performing block code based error correction during signal modulation in the communications system; and
making at least one code word decision with minimum error power-based criteria during said block code based error correction with a decision feedback equalization filter that removes post cursor inter-symbol interference (ISI) within at least one error correction code word, wherein said block code based error correction utilizes a feed forward equalizer filter for filtering at least a feedback signal comprising information from said at least one error correction code word, and wherein said feedback signal comprises phase data.

14. The method of claim 13, wherein said making of said at least one code word decision comprises utilizing said decision feedback equalization filter to remove symbol interference from at least one previous error correction code word.

15. The method of claim 14, wherein said making of said at least one code word decision comprises utilizing a distortion filter in said decision feedback equalization filter, for generating filtered symbols.

16. The method of claim 15, comprising inserting a matrix multiplication-based filter after a feed forward equalizer filter and a feedback filter for symbol interference from symbols in said at least one previous error correction code word for said distortion filter.

17. The method of claim 15, comprising utilizing a decision metric for said decision feedback equalization filter, wherein scalar terms are added for each error correction code word to a decision metric of a real part of a projection of said filtered symbols to said at least one error correction code word.

* * * * *